US012321263B2

(12) United States Patent
Houssameddine et al.

(10) Patent No.: US 12,321,263 B2
(45) Date of Patent: Jun. 3, 2025

(54) SENSOR BASED MEMORY ARRAY DATA SCRUBBING

(71) Applicant: International Business Machines Corporation, Armonk, NY (US)

(72) Inventors: Dimitri Houssameddine, White Plains, NY (US); Heng Wu, Guilderland, NY (US); Krishna Thangaraj, Poughkeepsie, NY (US)

(73) Assignee: Internaional Business Machines Corporation, Armonk, NY (US)

( * ) Notice: Subject to any disclaimer, the term of this patent is extended or adjusted under 35 U.S.C. 154(b) by 297 days.

(21) Appl. No.: 17/184,673

(22) Filed: Feb. 25, 2021

(65) Prior Publication Data
US 2022/0269599 A1 Aug. 25, 2022

(51) Int. Cl.
G06F 12/02 (2006.01)
G01K 3/00 (2006.01)
G01R 33/02 (2006.01)
G06F 11/07 (2006.01)

(52) U.S. Cl.
CPC ......... *G06F 12/0253* (2013.01); *G01K 3/005* (2013.01); *G01R 33/02* (2013.01); *G06F 11/073* (2013.01); *G06F 11/076* (2013.01); *G06F 11/0793* (2013.01); *G06F 2212/1036* (2013.01)

(58) Field of Classification Search
CPC .. G06F 12/0253; G06F 11/073; G06F 11/076; G06F 11/0793; G06F 2212/1036; G01K 3/005; G01R 33/02
USPC .......................................................... 711/104
See application file for complete search history.

(56) References Cited

U.S. PATENT DOCUMENTS

| 6,999,339 | B2 | 2/2006 | Tuttle |
| 9,342,403 | B2 | 5/2016 | Keppel |
| 9,361,196 | B2 | 6/2016 | Kleveland |
| 9,595,354 | B2 | 3/2017 | Kern |
| 9,727,413 | B2 | 8/2017 | Cordero |
| 10,026,483 | B1 | 7/2018 | Shah |
| 10,198,221 | B2 | 2/2019 | Cha |
| 10,521,293 | B2 | 12/2019 | Cha |

(Continued)

FOREIGN PATENT DOCUMENTS

WO 2017065802 A1 4/2017

OTHER PUBLICATIONS

Smullen, Clinton Willis, IV, "Designing Giga-scale Memory Systems with STT-RAM", A Dissertation Presented to the Faculty of the School of Engineering and Applied Science University of Virginia, Dec. 2011, 158 pages.

*Primary Examiner* — Jared I Rutz
*Assistant Examiner* — Wei Ma
(74) *Attorney, Agent, or Firm* — Aaron N. Pontikos

(57) ABSTRACT

According to one embodiment of the present invention, a computer-implemented method for dynamically altering a frequency at which data scrubbing is performed on a memory device is disclosed. The computer-implemented method includes monitoring at least one of a temperature and a magnetic field of the memory device. The computer-implemented method further includes, responsive to determining that at least one of the temperature and the magnetic field of the memory device reaches and/or exceeds a predetermined threshold, respectively, increasing the frequency at which data scrubbing is performed on the memory device.

14 Claims, 9 Drawing Sheets

(56) References Cited

U.S. PATENT DOCUMENTS

| | | | |
|---|---|---|---|
| 10,522,238 B1 | 12/2019 | Huang | |
| 10,657,014 B2 | 5/2020 | Baty | |
| 10,824,365 B2 | 11/2020 | Jung | |
| 2003/0191888 A1* | 10/2003 | Klein | G11C 11/4076 |
| | | | 711/105 |
| 2010/0332900 A1 | 12/2010 | Yang | |
| 2018/0067804 A1* | 3/2018 | Chinnakkonda Vidyapoornachary | G06F 3/0619 |
| 2018/0246678 A1 | 8/2018 | Cha | |
| 2020/0218617 A1* | 7/2020 | Knestele | G06F 9/5027 |
| 2020/0387323 A1* | 12/2020 | Boehm | G06F 11/1076 |
| 2021/0311827 A1* | 10/2021 | Lu | G06F 3/064 |
| 2024/0211344 A1* | 6/2024 | Bains | G11C 29/028 |

* cited by examiner

SENSOR BASED MEMORY ARRAY DATA SCRUBBING

BACKGROUND OF THE INVENTION

The present invention relates generally to the field of data scrubbing, and more particularly to scrubbing data stored in memory arrays.

Data scrubbing is an error detection and correction technique that uses a background task to periodically inspect memory, disk arrays, files systems or field programmable gate arrays (FPGAs). Detected errors are corrected by modifying or removing incomplete, incorrect, inaccurately formatted, or repeated data stored in memory. For example, detected errors are corrected using redundant data in the form of different checksums or copies of data. The key objective of data scrubbing is to make the data more accurate and consistent. Data scrubbing reduces the likelihood that single correctable errors will accumulate, leading to reduced risks of uncorrectable errors. Data scrubbing helps to relax the data retention requirement of a memory array, such as a magnetoresistive random access memory (MRAM) array, by correcting accumulated errors, and thereby reducing the energy barrier ($E_b$) requirement. As a result of reducing the energy barrier requirement, the write voltage can be reduced to achieve the same error rate, which ultimately improves the overall endurance of the memory array.

Memory arrays can efficiently store large amounts of data. A memory array is built as a two-dimensional array of bit cells, each of which stores 1 bit of data. The most common types of memory arrays include dynamic random access memory (DRAM), static random access memory (SRAM), (MRAM), and read only memory (ROM).

SUMMARY

According to one embodiment of the present invention, a computer-implemented method for dynamically altering a frequency at which data scrubbing is performed on a memory device is disclosed. The computer-implemented method includes monitoring at least one of a temperature and a magnetic field of the memory device. The computer-implemented method further includes, responsive to determining that at least one of the temperature and the magnetic field of the memory device reaches and/or exceeds a predetermined threshold, respectively, increasing the frequency at which data scrubbing is performed on the memory device.

According to another embodiment of the present invention, a computer program product for dynamically altering a frequency at which data scrubbing is performed on a memory device is disclosed. The computer program product includes one or more computer readable storage media and program instructions stored on the one or more computer readable storage media. The program instructions include instructions to monitor at least one of a temperature and a magnetic field of the memory device. The program instructions further include instructions to increase the frequency at which data scrubbing is performed on the memory device in response to determining that at least one of the temperature and the magnetic field of the memory device reaches and/or exceeds a predetermined threshold, respectively.

According to another embodiment of the present invention, a computer system for dynamically altering a frequency at which data scrubbing is performed on a memory device is disclosed. The computer system includes one or more computer system includes one or more computer processors, one or more computer readable storage media, and program instructions stored on the computer readable storage media for execution by at least one of the one or more processors. The program instructions include instructions to monitor at least one of a temperature and a magnetic field of the memory device. The program instructions further include instructions to increase the frequency at which data scrubbing is performed on the memory device in response to determining that at least one of the temperature and the magnetic field of the memory device reaches and/or exceeds a predetermined threshold, respectively.

DETAILED DESCRIPTION

Figure 1:
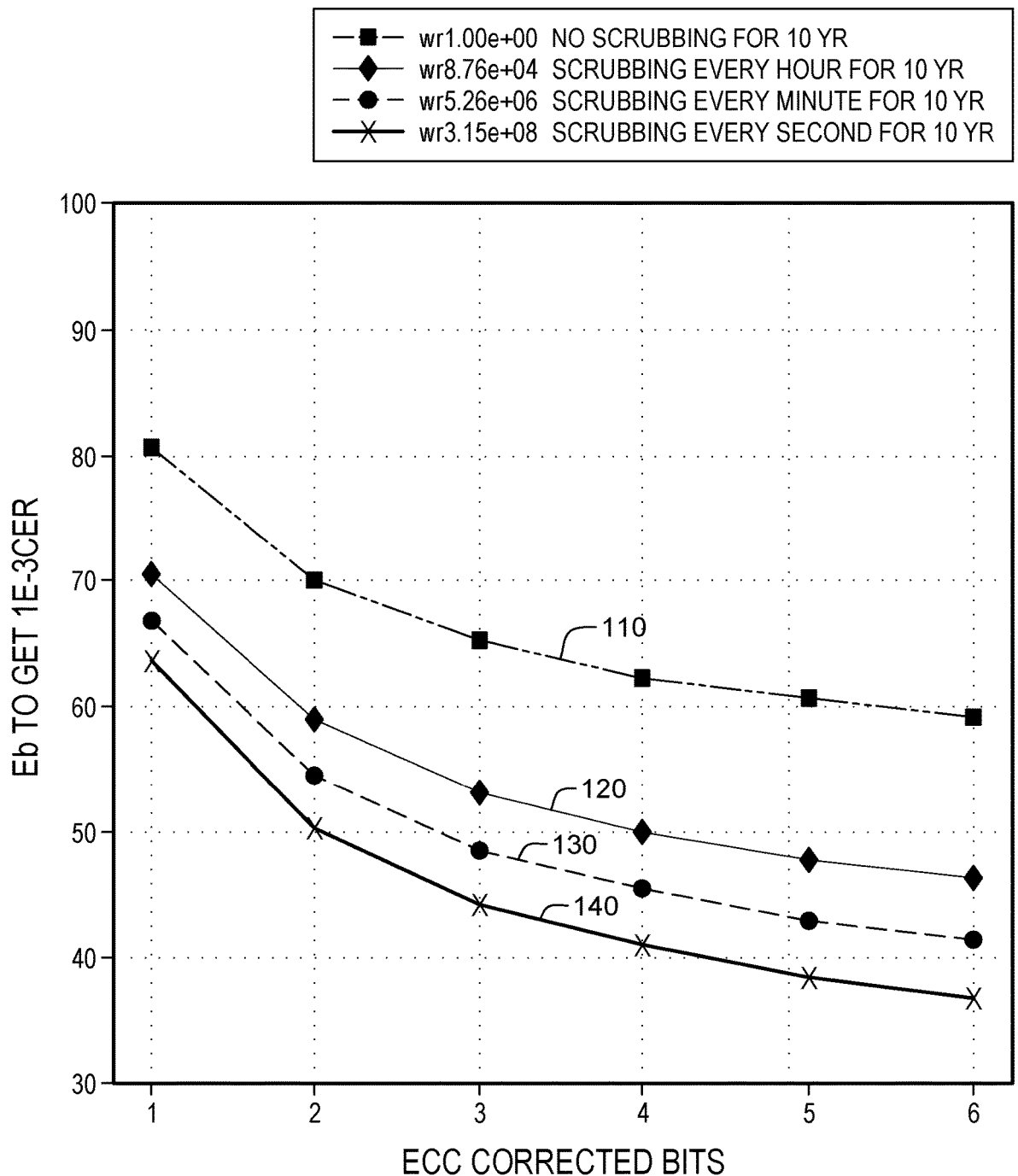
FIG. 1 is a plot depicting the inverse relationship between different error correction code (ECC) schemes and required energy barrier ($E_b$) level of a 1 Gb MRAM chip to achieve the target chip error rate (CER) at various data scrubbing frequencies.

The present invention relates generally to the field of data scrubbing, and more particularly to scrubbing data stored in memory arrays.

Unlike conventional random access memory (RAM) chips, data in Magnetoresistive RAM (MRAM) chips is not stored as electric charges or current flows, but rather as magnetic storage elements. The magnetic storage elements are typically formed from two ferromagnetic plates, each of which can hold a magnetization, separated by a thin insulating layer. One of the plates is a permanent magnet set to a particular polarity, while the other plates magnetization can be changed to match that of an external field to store memory. This configuration is known as a magnetic tunnel junction (MTJ) and is the simplest structure for an MRAM bit.

Spin-Transfer Torque MRAM (STT-MRAM) is a particular type of MRAM in which the orientation of a magnetic layer in a magnetic tunnel junction (such as an STT tunnel junction (STT-MTJ)) or spin valve can be modified using a spin-polarized current. STT-MRAM is a non-volatile memory with near-zero leakage power consumption which is a major advantage over charge-based memories such as SRAM and DRAM. STT-MRAM also has the advantages of lower power consumption and better scalability than conventional MRAM which uses magnetic fields to flip the active elements.

Embodiments of the present invention recognize that optimizing MRAM and/or STT-MRAM devices for last level cache (LLC) applications (i.e., a system cache that reduces the number of accesses to off-chip memory) continues to be a major technological challenge. One such challenge is maintaining a balance between data retention (an ability of a memory bit to retain its data state) and performance (e.g., speed and cycling endurance). If data retention is of greater importance, one possible way to reduce the chip error rate (CER), and thereby maintain greater data retention, is to increase the energy barrier ($E_b$) of an MRAM chip. However, as the energy barrier increases, so too does the voltage required to flip a bit from one state to the other. This increased voltage over time will ultimately lead to a decrease in the cycling endurance and longevity of the MRAM chip.

On the other hand, if performance is of greater importance, increased performance of MRAM devices for LLC applications can be achieved by relaxing the data retention properties of the MRAM. For example, lowering the energy barrier of a magnetic tunnel junction (MTJ) stack will increase performance since less energy is required to flip a bit, and thus, a bit may be flipped from one state to the other faster. However, by lowering the energy barrier of MRAM bits, new problems, such as thermal instability caused by increased sensitivity to fluctuations in temperature and magnetic fields is introduced. Specifically, higher temperatures and external field fluctuations caused by lowering the energy will lead to increased chip error rates (CERs), which will ultimately lead to chip malfunctions.

Embodiments of the present invention recognize that one possible solution to reduce the chip error rate (CER) at a lower Eb is to increase the error correction code (ECC) strength by increasing the number of ECC bits. As the number of ECC bits increases, the CER rate decreases. However, increasing the number of ECC bits results in increased energy consumption, a less efficient storage/area ratio, and the need for a more complex circuit design.

Embodiments of the present invention recognize that another solution to reduce the CER at a lower energy barrier is to increase the scrubbing frequency (i.e., the frequency at which data is read, corrected, and written back to the MRAM). Referring now to the plot in FIG. 1, a plot depicting the inverse relationship between different error correction code (ECC) schemes and required energy barrier ($E_b$) level of a 1 Gb MRAM chip to achieve the target chip error rate (CER) at various data scrubbing frequencies can be seen. Specifically, the plot depicts the impact that different scrubbing frequencies have on the energy barrier required to maintain a target CER of 1E-3 on a 1 Gb MRAM chip over the course of a ten year period. Line 110 represents the $E_b$ level of a 1 Gb MRAM chip over the course of a 10 year period with no data scrubbing. Line 120 represents the $E_b$ level of a 1 Gb MRAM chip over the course of a 10 year period with data scrubbing performed every hour. Line 130 represents the $E_b$ level of a 1 Gb MRAM chip over the course of a 10 year period with data scrubbing performed every minute. Line 140 represent the $E_b$ of a 1 Gb MRAM chip over the course of a 10 period with data scrubbing performed every second.

Although the various data scrubbing frequencies keep the overall CER the same, the required energy barrier to maintain the same CER decreases as the scrubbing frequency increases. Lowering the energy barrier is advantageous since the critical voltage (Vc) necessary for MTJ switching decreases as the energy barrier decreases. A lower Vc also translates to a lower operating voltage of MTJ arrays, which ultimately results in improved cycling endurance, reliability, and overall chip performance. However, performing data scrubbing at a high frequency over a prolonged period of time results in increased energy consumption, and increased physical wear due to additional error correction writes, which ultimately results in a decrease in the lifetime of the MRAM chip.

Embodiments of the present invention further recognize that the temperature and/or magnetic field strength of an MRAM device inversely impact the energy barrier of an MRAM device. As the temperature and/or magnetic field strength of an MRAM device increases, the energy barrier ($E_b$) of the MRAM device decreases. Similarly, as the temperature and/or magnetic field strength of an MRAM device decreases, the energy barrier of the MRAM device increases. Moreover, embodiments of the present invention recognize that the energy barrier of an MRAM device inversely impacts the chip error rate of the MRAM device. As the energy barrier of an MRAM device increases, the number of errors that accumulate over time decreases, thereby resulting in a lower chip error rate. Similarly, as the energy barrier of an MRAM device decreases, the number of errors that accumulate over time increases, thereby resulting in a higher chip error rate.

Figure 2:
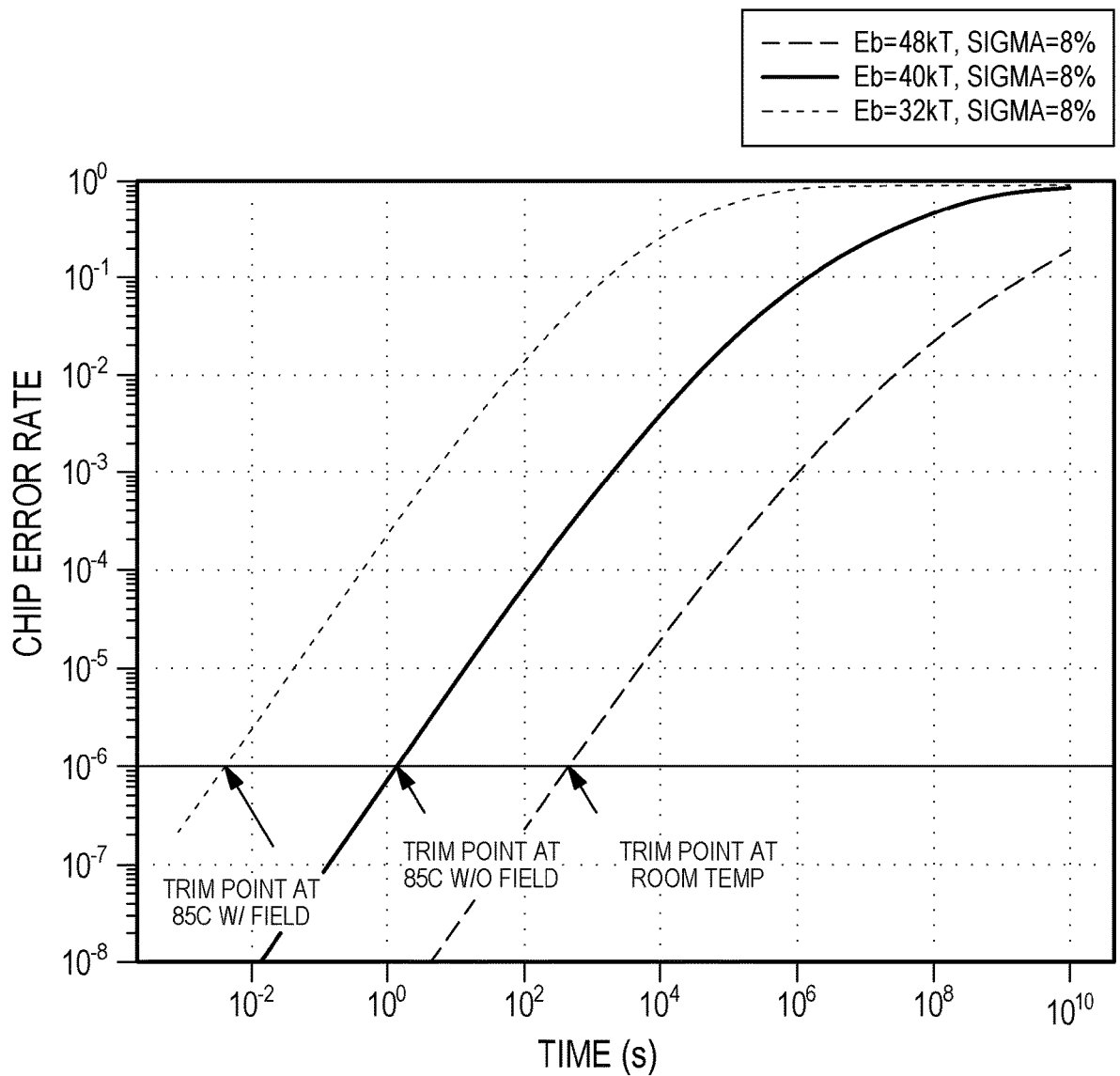
FIG. 2 is a plot depicting a typical trend of chip error rate (CER) evolving with time for a 1 Gb MRAM chip with various energy barriers.

Referring now to FIG. 2, a plot depicting the typical trend of chip error rate (CER) evolving with time for a 1 Gb MRAM chip with various energy barriers ($E_b$s) can be seen. According to FIG. 2, an MTJ stack at room temperature has an energy barrier of 48 kT. If the operating temperature of the MTJ stack increases to 85° C., the energy barrier of the MTJ stack drops to 40 kT. Similarly, if the operating temperature of the MTJ stack increases to 85° C. and a magnetic field is present (assuming 300 Oe applied and Hk=3000 Oe), the energy barrier of the MTJ stack drops further to 32 kT. As depicted by FIG. 2, as the energy barrier of the MTJ stack decreases, the rate at which errors accumulate over time increases.

Embodiments of the present invention recognize that in order to maintain a constant chip error rate (e.g., 1E-6) across different operating scenarios (such as those depicted in FIG. 2), the frequency of data scrubbing need not remain constant. For example, a data scrubbing frequency of roughly every five milliseconds is required to maintain a chip error rate of 1E-6 for the MTJ stack operating at 85° C. and with the presence of a magnetic field (assuming 300 Oe applied and Hk=3000 Oe). However, a data scrubbing frequency of roughly one second is required to maintain the same chip error rate of 1E-6 for the MTJ stack operating at 85° C. with no magnetic field (the vast majority of the lifetime of the chip) and a data scrubbing frequency of roughly two-hundred seconds is required to maintain a chip error rate of 1E-6 for the MTJ stack at room temperature.

This will result in a reduction of at least 200× the power consumed during current scrubbing methods in which data scrubbing is performed based on an accumulation of a particular number of errors.

Embodiments of the present invention provide a computer-implemented method and system that improves MRAM performance (speed and cycling endurance) for LLC applications while maintaining a desired CER at a lower energy barrier. Whereas current solutions scrub data stored in MRAM memory arrays based on an accumulation of a predetermined number of errors detected during reads, embodiments of the present invention perform data scrubbing as a background process, in which the frequency at which data scrubbing is performed is dynamically adjusted based on the operating temperature and applied magnetic field of an MRAM device. Thus, depending on the operating temperature and magnetic field strength of an MRAM, embodiments of the present invention dynamically alter the frequency in which data scrubbing is performed, thereby limiting the number of data scrubbing cycles while still maintaining a desired chip error rate over the lifetime of the chip, and ultimately improving chip performance and endurance.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suit-able combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting. Notwithstanding, several definitions that apply throughout this document now will be presented.

As defined herein, the singular forms "a," "an," and "the" include the plural forms as well, unless the context clearly indicates otherwise.

As defined herein, "another" means at least a second or more.

As defined herein, "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, "automatically" and "dynamically" mean without user intervention.

As defined herein, "includes," "including," "comprises," and/or "comprising," specify the presence of stated features, integers, steps, operations, elements, and/or components, but do not preclude the presence or addition of one or more other features, integers, steps, operations, elements, components, and/or groups thereof.

As defined herein, "if" means "in response to" or "responsive to," depending upon the context. Thus, the phrase "if it is determined" may be construed to mean "in response to determining" or "responsive to determining" depending on the context. Likewise the phrase "if [a stated condition or event] is detected" may be construed to mean "upon detecting [the stated condition or event]" or "in response to detecting [the stated condition or event]" or "responsive to detecting [the stated condition or event]" depending on the context.

As defined herein, "one embodiment," "an embodiment," "in one or more embodiments," "in particular embodiments," or similar language mean that a particular feature, structure, or characteristic described in connection with the embodiment is included in at least one embodiment described within this disclosure. Thus, appearances of the aforementioned phrases and/or similar language throughout this disclosure may, but do not necessarily, all refer to the same embodiment.

As defined herein, the phrases "in response to" and "responsive to" mean responding or reacting readily to an action or event. Thus, if a second action is performed "in response to" or "responsive to" a first action, there is a causal relationship between an occurrence of the first action and an occurrence of the second action. The phrases "in response to" and "responsive to" indicate the causal relationship.

As defined herein, "real time" means a level of processing responsiveness that a user or system senses as sufficiently immediate for a particular process or determination to be made, or that enables the processor to keep up with some external process.

As defined herein, "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

As defined herein, "user" and "individual" each refer to a human being.

The terms first, second, etc. may be used herein to describe various elements. These elements should not be limited by these terms, as these terms are only used to distinguish one element from another unless stated otherwise or the context clearly indicates otherwise.

Figure 3:
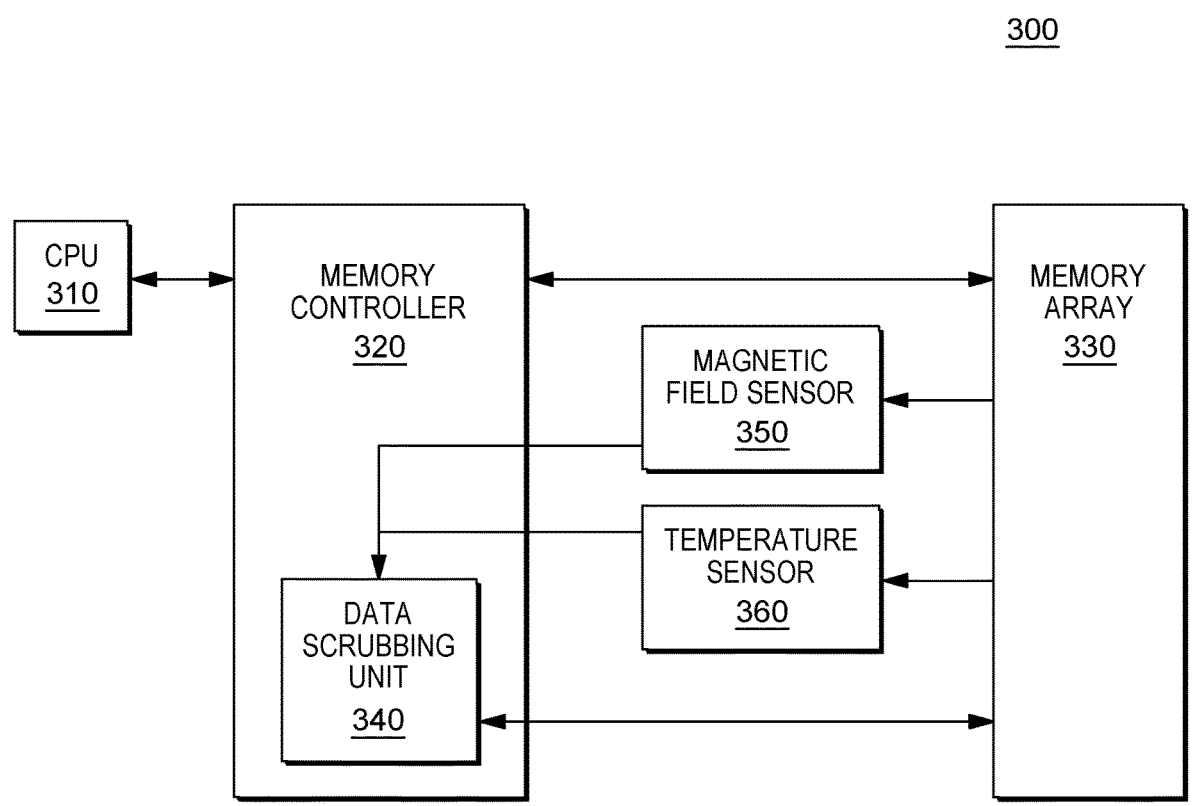
FIG. 3 is a functional block diagram of a computer system, generally designated 300, for dynamically altering the data scrubbing frequency of an MRAM chip in accordance with at least one embodiment of the present invention.

FIG. 3 is a functional block diagram of a computer system, for dynamically altering the data scrubbing frequency of an MRAM chip in accordance with at least one embodiment of the present invention. FIG. 3 includes central processing unit (CPU) 310, memory controller 320, memory array 330, data scrubber unit 340, magnetic field sensor 350, and temperature sensor 360. Although computer system 300 is depicted with a single CPU 310, memory controller 320, memory array 330, data scrubber unit 340, magnetic field sensor 350, and temperature sensor 360, it should be appreciated that in other embodiments, computer system 300 may have any number of additional elements (e.g., multiple CPU's, multiple memory controllers, multiple memory arrays, etc.). In an embodiment, memory controller 320 is embedded on the same chip as memory array 330. In an alternative embodiment, memory controller 320 and memory array 330 are embedded on different chips. For example, memory controller 320 may be embedded on its own chip or on the same chip as CPU 310. In an embodiment, data scrubbing unit 340 is embedded on the same chip as memory array 330. In an alternative embodiment, data scrubbing unit 340 and memory array 330 are embedded on different chips. For example, data scrubbing unit 330 may be embedded on the same chip as memory controller 320.

CPU 310 may be a single core or multi-core processor. In an embodiment, memory controller 320 is coupled to CPU 310 and receives read/write (R/W) requests from CPU 310. For example, CPU 310 may communicate with memory controller 320 through various interface protocols such as Peripheral Component Interconnect-Express (PCI-E), Advanced Technology Attachment (ATA), Serial ATA (SATA), Parallel ATA (PATA), or serial attached SCSI (SAS). In another example, CPU 310 may communicate with memory controller 320 through interface protocols such as Universal Serial Bus (USB), Multi-Media Card (MMC), Enhanced Small Disk Interface (ESDI), or Integrated Drive Electronics (IDE).

Memory controller 320 controls the overall operation and data exchange of memory array 330. In an embodiment, memory controller 320 reads data from and writes data to memory array 330. In an embodiment, memory controller 320 is coupled to CPU 310 and receives read or write requests from CPU 310. For example, memory controller 320 may read data from memory array 330 or write data to memory array 330 in response to receiving a read/write request from CPU 310. In an embodiment, memory controller 320 issues operation commands to memory array 330 for controlling the operation of memory array 330.

In an embodiment, memory controller 320 issues operation commands to data scrubber unit 340 to initialize and/or control the operation of data scrubbing operations performed on memory array 330. However, in alternative embodiments, it should be appreciated that some or all of the operation commands to initialize and/or control the operation of data scrubbing operations performed on memory array 330 may also be issued by data scrubber unit 340.

In an embodiment, memory controller 320 issues operation commands to data scrubber unit 340 to begin data scrubbing on memory array 330. In an embodiment, memory controller 320 issues operation commands to data scrubber unit 340 to terminate data scrubbing on memory array 330. In an embodiment, memory controller 320 issues operation commands to data scrubber unit 340 to increase the frequency at which data scrubbing is performed on memory array 330. In an embodiment, memory controller 320 issues operation commands to data scrubber unit 340 to decrease the frequency at which data scrubbing is performed on memory array 330.

In an embodiment, program instructions for dynamically altering the data scrubbing frequency of memory array 330 are stored in non-volatile memory elements prior to packaging. For example, program instructions for dynamically altering the data scrubbing frequency based on detected temperatures and/or magnetic field strengths may be stored in non-volatile memory of memory controller 320, memory array 330, and/or data scrubber unit 340. In an embodiment, the particular temperature and magnetic field threshold levels that trigger an alert to alter the data scrubbing frequency are preset by the memory array manufacturer in order to maintain an acceptable chip error rate as determined by the memory array manufacturer. In an embodiment, the particular temperature and magnetic field threshold levels that trigger an alert to alter the data scrubbing frequency are programmable and can vary based on a current workload using memory array 330, the characteristics of data stored on the memory array, and/or an acceptable chip error rate as determined by the purchaser of the memory array. In an embodiment, the particular data scrubbing frequencies for respective operating conditions of memory array 330 are also stored in non-volatile memory elements prior to packaging.

As an example, a 1 Gb MRAM device may have the following data scrubbing instructions stored in non-volatile memory of memory controller 320: (i) If the temperature of the MRAM device reaches and/or exceeds room temperature, commence data scrubbing every two-hundred seconds; (ii) If the temperature of the MRAM device reaches and/or exceeds 85° C. and no magnetic field is detected, commence data scrubbing every 1 second; and (iii) If the temperature of the MRAM device reaches and/or exceeds 85° C. and a magnetic field is detected, commence data scrubbing every five milliseconds.

In another example, a 1 Gb MRAM device may have the following data scrubbing instructions stored in non-volatile memory of memory controller 320: (i) For every n ° C. rise or fall in the temperature of the MRAM device, increase/decrease data scrubbing frequency by x; (ii) For every increase or decrease in n units of Tesla (T) generated by the MRAM device, increase/decrease data scrubbing frequency by y.

In an alternative embodiment, memory controller 320 does not alter the scrubbing frequency. In an embodiment, memory controller 320 dynamically increases the ECC strength in response to detecting an the presence of a magnetic field generated by memory array 330. In an embodiment, memory controller 320 dynamically increases the ECC strength in response to detecting an increase in the magnetic field strength generated by memory array 330. In an embodiment, memory controller 320 dynamically decreases the ECC strength in response to detecting an absence of a magnetic field generated by memory array 330. In an embodiment, memory controller 320 dynamically decreases the ECC strength in response to detecting a decrease in the magnetic field strength generated by memory array 330. In an embodiment, memory controller 320 dynamically increases the ECC strength in response to detecting an increase in the internal and/or external temperature of memory array 330. In an embodiment, memory controller 320 dynamically decreases the ECC strength in response to detecting a decrease in the internal and/or external temperature of memory array 330.

Memory array 330 is a semiconductor device formed from a plurality of memory cells arranged in a matrix. Memory array 330 further includes a plurality of word lines and a plurality of bit lines connected to the memory cells. The plurality of word lines may be connected to the rows of the memory cells and the plurality of bit lines may be connected to the columns of the memory cells. The memory cells of memory array 330 may include, but are not limited to, dynamic random-access memory (DRAM) cells, static random-access memory (SRAM) cells, flash memory cells, phase change random-access memory (PRAM) cells, resistance random-access memory (ReRAM) cells, magnetoresistive random-access memory (MRAM) cells, and spin-transfer torque (SPT) MRAM (SPT-MRAM) cells.

Memory array 330 may include typical circuits associated with a memory device, such as row decoders, column decoders, and sense amplifiers. In an embodiment, the row decoder selects word lines connected to memory array 330. In an embodiment, the row decoder decodes a row address received from memory controller 320, selects any one word line corresponding to the row address, and activates the selected word line. In an embodiment, the column decoder selects particular bit lines among the plurality of bit lines of memory array 330. In an embodiment, column decoder decodes a column address received from memory controller 320 and selects a particular bit line corresponding to the column address. In an embodiment, the sense amplifiers are connected to the bit lines of memory array 330. The sense amplifiers may sense a voltage change of the selected bit line, amplify, and output the sensed voltage change. In an embodiment, data output by the sense amplifiers may be transmitted to an external device via memory controller 320.

Data scrubber unit 340 is connected to memory array 330. In various embodiments, data scrubber unit 340 performs error correction coding (ECC) of data stored in memory array 330. Data scrubber unit 340 is described in further detail below with reference to FIG. 4.

Magnetic field sensor 350 is a sensor configured to sense a level of magnetic field generated by memory array 330. Magnetic field sensor 350 may be any type of sensor generally known by one of ordinary skill in the art that can sense a level of magnetic field generated by a memory technologies. In an embodiment, one or more magnetic field sensors 350 are built into an integrated circuit chip to collect magnetic field data during operation of memory array 330. For example, an in situ magnetic sensor on an MRAM is built with a magnetic field sensor built into the chip. This allows direct measurement of the magnetic environment of the integrated circuit (e.g., inside of a magnetically shielded package) during operation or manufacture of the device. In an alternative embodiment, magnetic field sensor 350 is located off-chip from memory array 330. In an embodiment, the magnetic field data received from magnetic field sensor 350 is used to determine whether data scrubbing is required and if so, the particular frequency at which data scrubbing should be performed. In an embodiment, the magnetic field data received from magnetic field sensor 350 is used to determine whether the current frequency at which data scrubbing is currently being performed should be altered (increase or decrease the scrubbing frequency).

Temperature sensor 360 is a sensor configured to sense the temperature of memory array 330. Temperature sensor 360 may be any type of sensor known by one of ordinary skill in the art that can sense the temperature (external or internal) of any generally known or future known memory technologies. In an embodiment, one or more temperature sensors 360 are built into an integrated circuit chip to collect temperature data during operation of memory array 330. For example, an in situ temperature sensor on an MRAM is built with a temperature sensor built into the chip. This allows direct measurement of the internal temperature of the integrated circuit (e.g., inside of a magnetically shielded package) during operation or manufacture of the device. In an alternative embodiment, temperature sensor 360 is located off-chip from memory array 330. In an embodiment, the temperature data received from temperature sensor 360 is used to determine whether data scrubbing is required and if so, the particular frequency at which data scrubbing should be performed. In an embodiment, the temperature data received from temperature sensor 360 is used to determine whether the current frequency at which data scrubbing is currently being performed should be altered (increase or decrease the scrubbing frequency).

Figure 4:
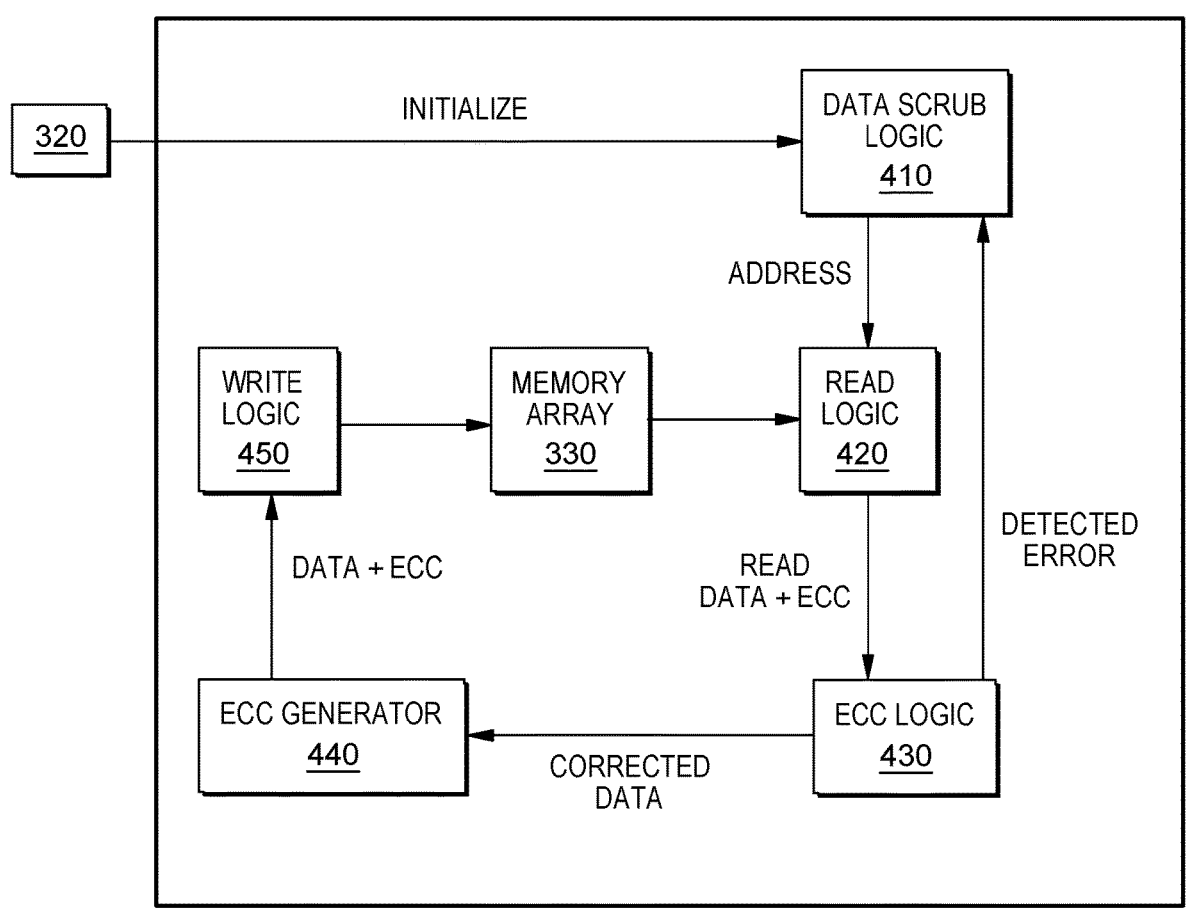
FIG. 4 is a functional block diagram of a data scrubber unit, generally designated 400, used to perform data scrubbing on an MRAM chip in accordance with at least one embodiment of the present invention.

FIG. 4 is a block diagram of data scrubbing logic 410 performed by data scrubber unit 340 in accordance with at least one embodiment of the present invention. Data scrubbing logic 410 is used to perform internal memory scrubbing of single bit fails in memory locations in memory array 330. In an embodiment, data scrubbing logic 410 is initialized by memory controller 320 based on sensor data received from at least one of magnetic field sensor 350 and temperature sensor 360. In an embodiment, data scrubber unit 340 initializes data scrubbing logic 410 based on sensor data received from at least one of magnetic field sensor 350 and temperature sensor 360. In an embodiment, data scrubbing logic 410 cycles through each of the memory locations in memory array 330. In an embodiment, if no errors are detected in a memory location, a read-only-operation (ROO) is performed. In an embodiment, if one or more errors are detected in a memory location, a read-modify-write (RMW) operation is performed.

As depicted in FIG. 4, data scrubbing logic 410 sends the current address of the memory location to be scrubbed to read logic 420 which reads the data from memory array 330 at that memory location. The read data and ECC bits are input to ECC logic 430 to check for and correct any bit errors in the read data. ECC logic 430 notifies data scrubbing logic 410 of any detected bit errors. In an embodiment, data scrubbing logic 410 increments an error counter each time an error is detected.

As further depicted in FIG. 4, the corrected data is output from ECC logic 430 and input to ECC generator 440. ECC generator 440 generates ECC bits for the corrected data and outputs the corrected data containing the ECC bits to write logic 450, which writes the data containing the ECC bits back to memory array 330. The processes that include read logic 420, ECC logic 430, ECC generator 440, and write logic 450 may be referred to as a RMW operation which is used as part of the data scrubbing operation to write corrected data to memory array 330. In an embodiment, the modifying (M) and writing (W) portions of the RMW operation are only performed when an error is detected in the read data by ECC logic 430. In this instance, a data scrubbing operation that only performs a read operation may be referred to as a ROO.

Figure 5:
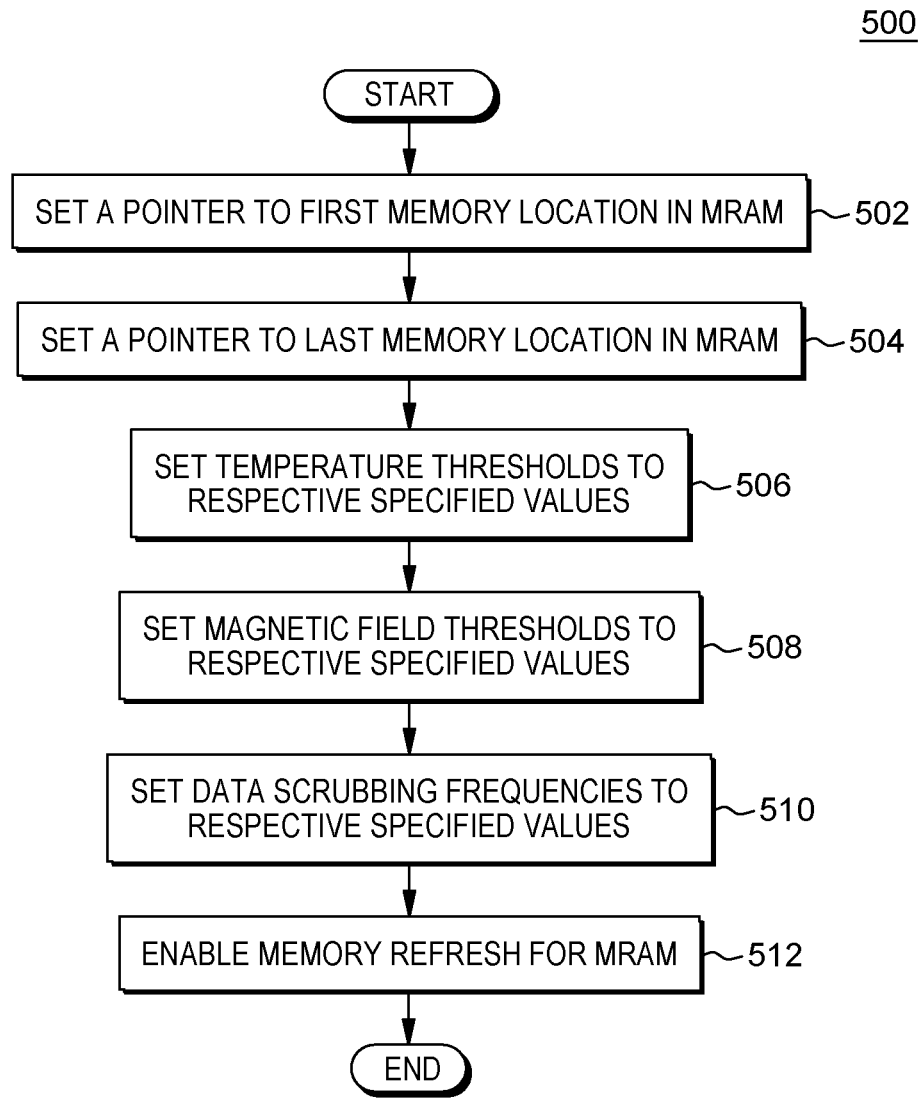
FIG. 5 is a flowchart diagram, generally designated 500, for initializing the dynamic alteration of the frequency at which data scrubbing is performed on an MRAM chip in accordance with at least one embodiment of the present invention.

FIG. 5 is a flowchart depicting operational steps for initializing the dynamic alteration of the frequency at which data scrubbing is performed on an MRAM. In an embodiment, the initializing shown in FIG. 5 can be controlled by memory controller 320 and/or data scrubber unit 340 of FIG. 3. Steps 502 through 512 can be performed as part of the initializing that happens when a MRAM device is powered on.

At step 502, a pointer to a current address of the MRAM is set to zero (e.g., it points to the first memory location in the MRAM). At step 504, an end address pointer is set to the last address in the MRAM (e.g., it points to the last memory location in the MRAM). At step 506, a set of temperature thresholds are set to respective specified values. The set of specified values can be stored in non-volatile memory elements of the MRAM and may be preset by the MRAM manufacturer. Alternatively, the set of specified temperature values are programmable. At step S508, a set of magnetic field thresholds are set to respective specified values. The set of specified values can be stored in non-volatile memory elements of the MRAM and may be preset by the MRAM manufacturer. Alternatively, the set of specified magnetic field values are programmable. At step 510, a set of data scrubbing frequencies associated with the set of temperature values and the set of magnetic field values are set to respective specified values. The set of specified data scrubbing frequency values can be stored in non-volatile memory elements of the MRAM and may be preset by the MRAM manufacturer to ensure an appropriate CER for the MRAM chip is maintained. Alternatively, the set of specified data scrubbing frequency values are programmable to ensure an acceptable CER according to the purchaser of the MRAM chip is maintained. At step 512, memory refresh is enabled for the MRAM.

Figure 6:
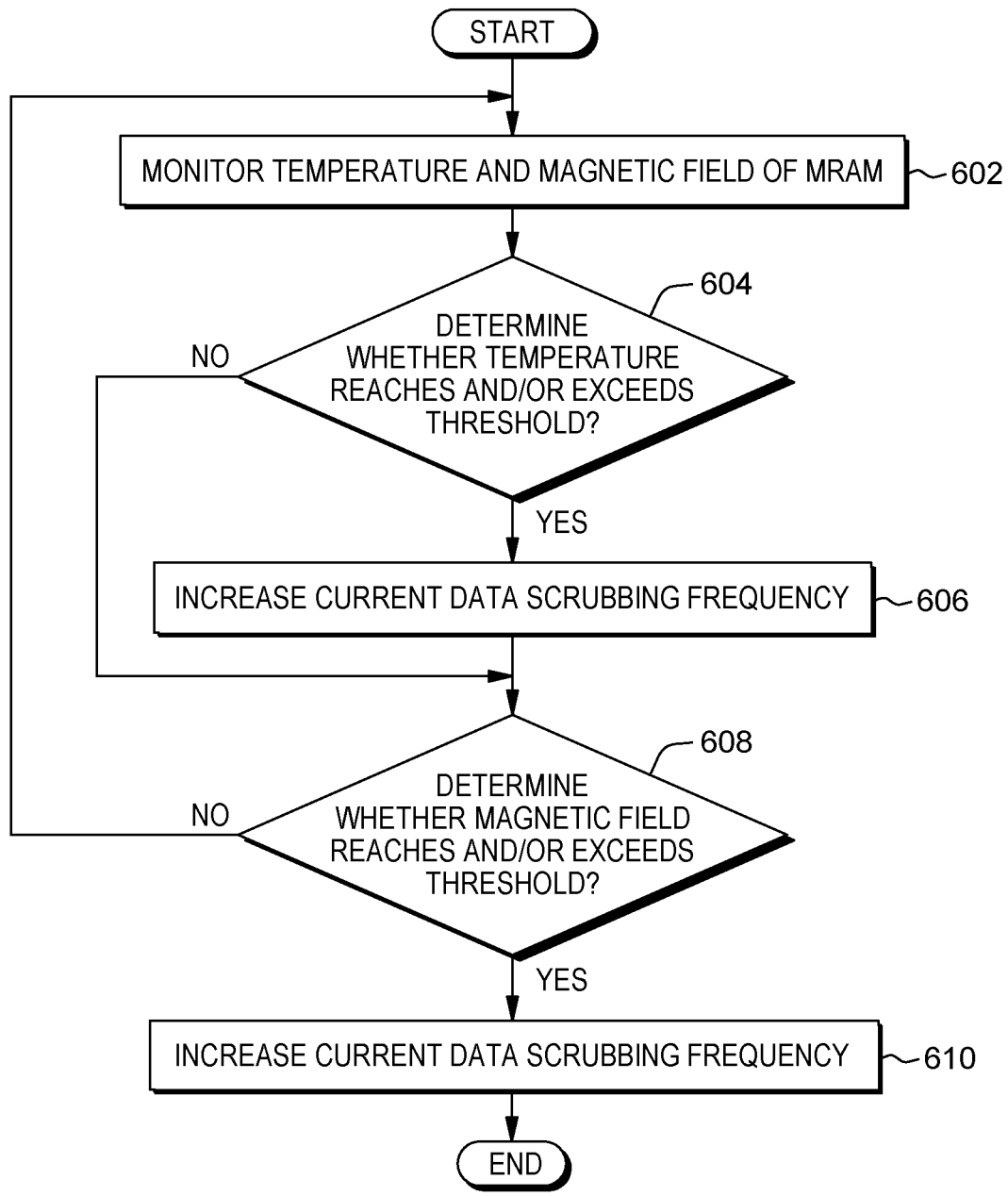
FIG. 6 is a flowchart diagram, generally designated 600, for determining whether to increase the frequency at which data scrubbing is performed on an MRAM chip in accordance with at least one embodiment of the present invention.

FIG. 6 is a flowchart depicting operational steps for dynamically increasing a frequency at which data scrubbing is performed on an MRAM based on detected sensor data in accordance with at least one embodiment of the present invention. It should be noted that although the operational steps in FIG. 6 reference a MRAM, the operational steps in FIG. 6 may equally be applied to any known or future known types of memory technologies or devices.

At step 602, the temperature and magnetic field strength of an MRAM device are monitored. At decision step 604, a determination is made whether a temperature of the MRAM device exceeds a predetermined threshold. If it is determined that the temperature of the MRAM device exceeds the predetermined threshold, the process proceeds to step 606. If it is determined that the temperature of the MRAM device does not exceed the predetermined threshold, the current data scrubbing frequency is maintained, and the process proceeds to decision step 608.

At step 606, in response to the temperature exceeding the predetermined threshold, the current data scrubbing frequency is increased.

At decision step 608, a determination is made whether a magnetic field strength exceeds a predetermined threshold. If it is determined that the magnetic field strength exceeds a predetermined threshold, the process proceeds to step 610. If it is determined that the magnetic field strength of the MRAM device does not exceed the predetermined threshold, the current data scrubbing frequency is maintained, and the process returns to step 602.

At step 610, in response to the magnetic field strength exceeding the predetermined threshold, the current data scrubbing frequency is increased.

Figure 7:
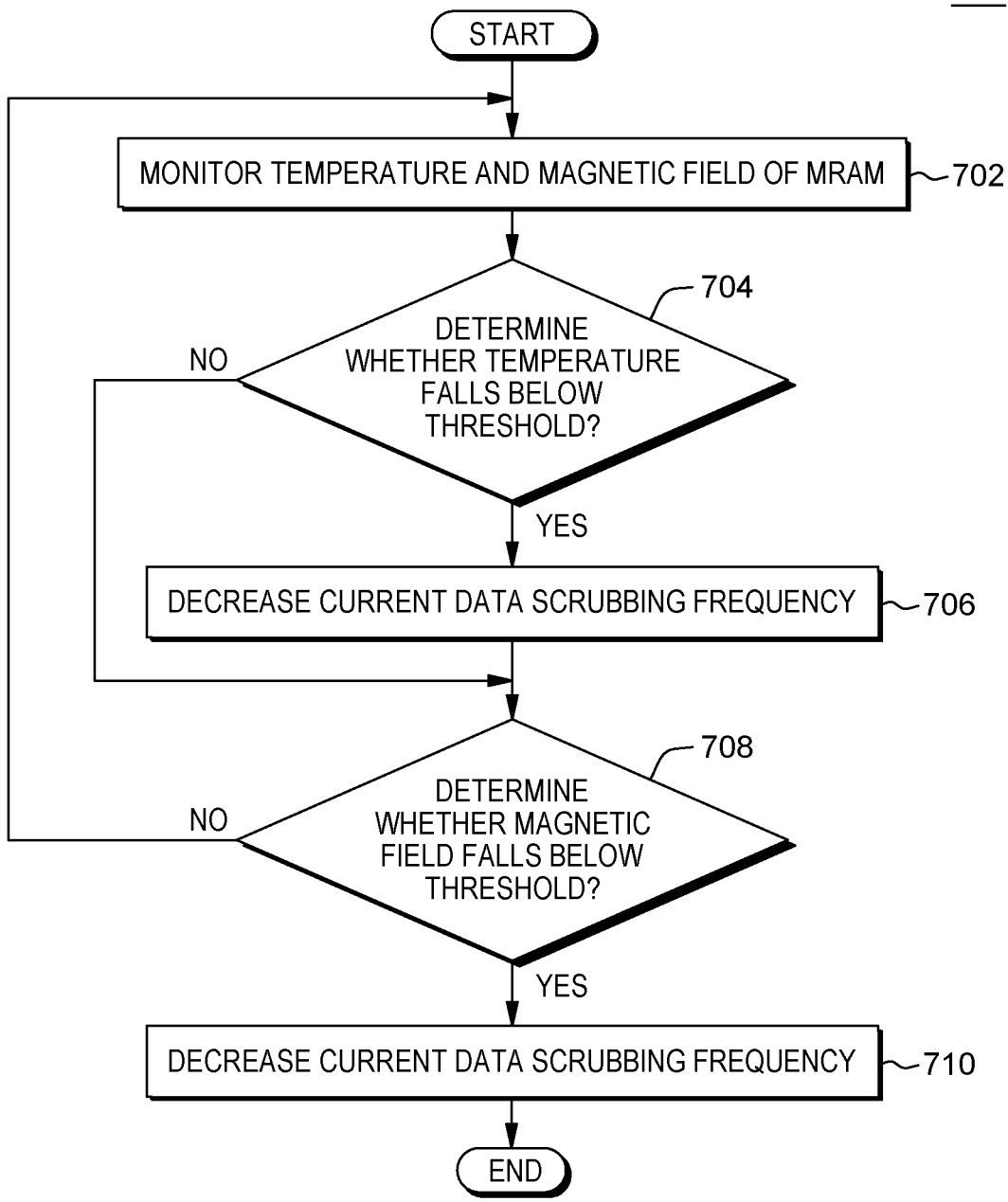
FIG. 7 is a flowchart diagram, generally designated 700, for determining whether to decrease the frequency at which data scrubbing is performed on an MRAM chip in accordance with at least one embodiment of the present invention.

FIG. 7 is a flowchart depicting operational steps for dynamically decreasing a frequency at which data scrubbing is performed on an MRAM based on detected sensor data in accordance with at least one embodiment of the present invention. It should be noted that although the operational steps in FIG. 6 reference a MRAM, the operational steps in FIG. 7 may equally be applied to any known or future known types of memory technologies or devices.

At step 702, the temperature and magnetic field strength of an MRAM device are monitored. At decision step 704, a determination is made whether a temperature of the MRAM device falls below a predetermined threshold. If it is determined that the temperature of the MRAM device falls below the predetermined threshold, the process proceeds to step 706. If it is determined that the temperature of the MRAM device does not fall below the predetermined threshold, the current data scrubbing frequency is maintained, and the process proceeds to decision step 708.

At step 706, in response to the temperature falling below the predetermined threshold, the current data scrubbing frequency is decreased.

At decision step 708, a determination is made whether a magnetic field strength falls below a predetermined threshold. If it is determined that the magnetic field strength falls below the predetermined threshold, the process proceeds to step 710. If it is determined that the magnetic field strength of the MRAM device does not fall below the predetermined threshold, the current data scrubbing frequency is maintained, and the process returns to step 702.

At step 710, in response to the magnetic field strength falling below the predetermined threshold, the current data scrubbing frequency is decreased.

Figure 8:
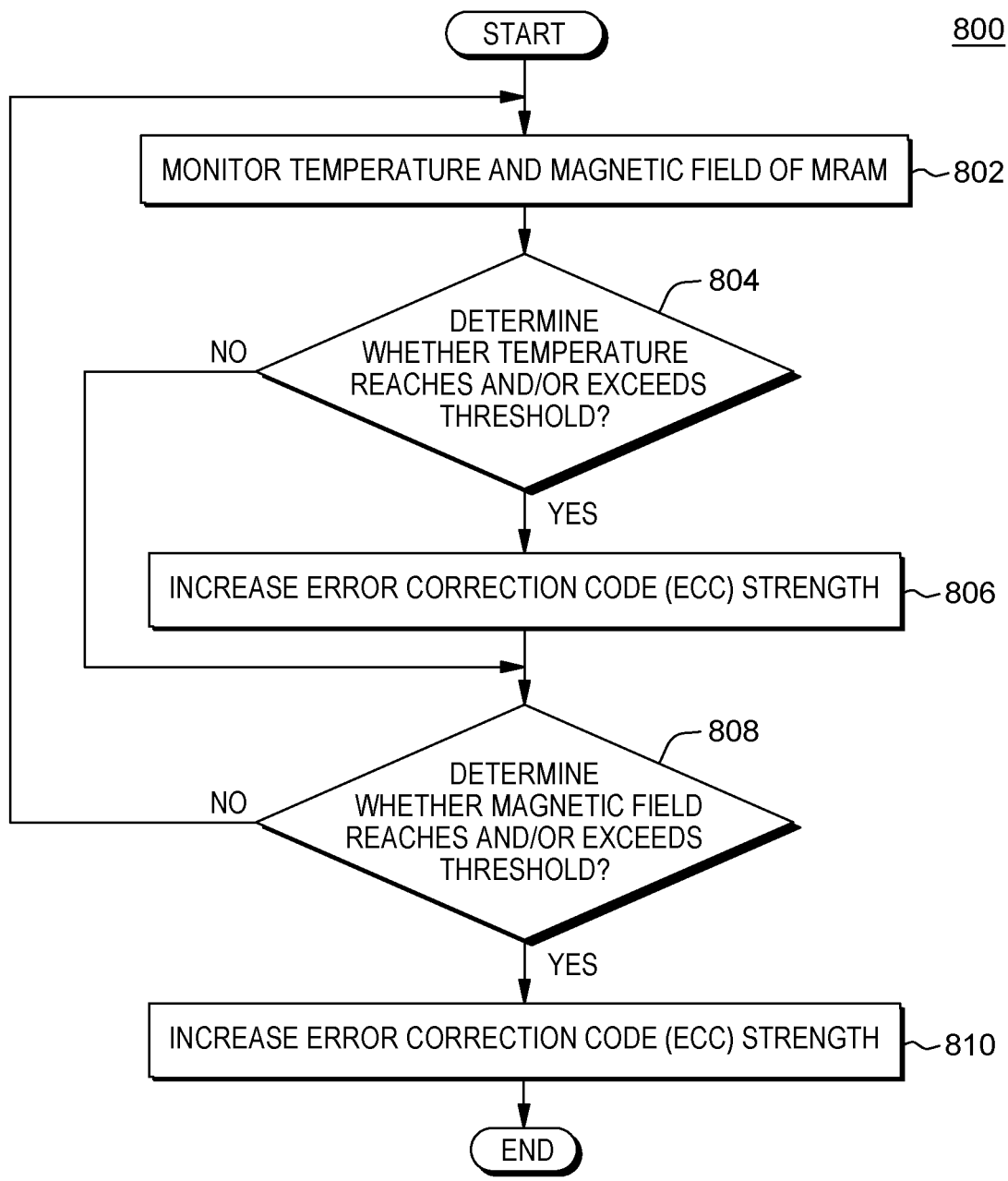
FIG. 8 is a flowchart diagram, generally designated 800, for determining whether to increase the error correction code strength for correcting bit errors in an MRAM chip in accordance with at least one embodiment of the present invention.

FIG. 8 is a flowchart depicting operational steps for dynamically increasing the ECC strength for correcting bit errors in an MRAM based on detected sensor data in accordance with at least one embodiment of the present invention. It should be noted that although the operational steps in FIG. 8 reference a MRAM, the operational steps in FIG. 8 may equally be applied to any known or future known types of memory technologies or devices.

At step 802, the temperature and magnetic field strength of an MRAM device are monitored. At decision step 804, a determination is made whether a temperature of the MRAM device exceeds a predetermined threshold. If it is determined that the temperature of the MRAM device exceeds the predetermined threshold, the process proceeds to step 806. If it is determined that the temperature of the MRAM device does not exceed the predetermined threshold, the current ECC strength is maintained, and process proceeds to decision step 808.

At step 806, in response to the temperature exceeding the predetermined threshold, the current ECC strength is increased.

At decision step 808, a determination is made whether a magnetic field strength exceeds a predetermined threshold. If it is determined that the magnetic field strength exceeds a predetermined threshold, the process proceeds to step 810. If it is determined that the magnetic field strength of the MRAM device does not exceed the predetermined threshold, the current ECC strength is maintained, and the process returns to step 802.

At step 810, in response to the magnetic field strength exceeding the predetermined threshold, the current ECC strength is increased.

Figure 9:
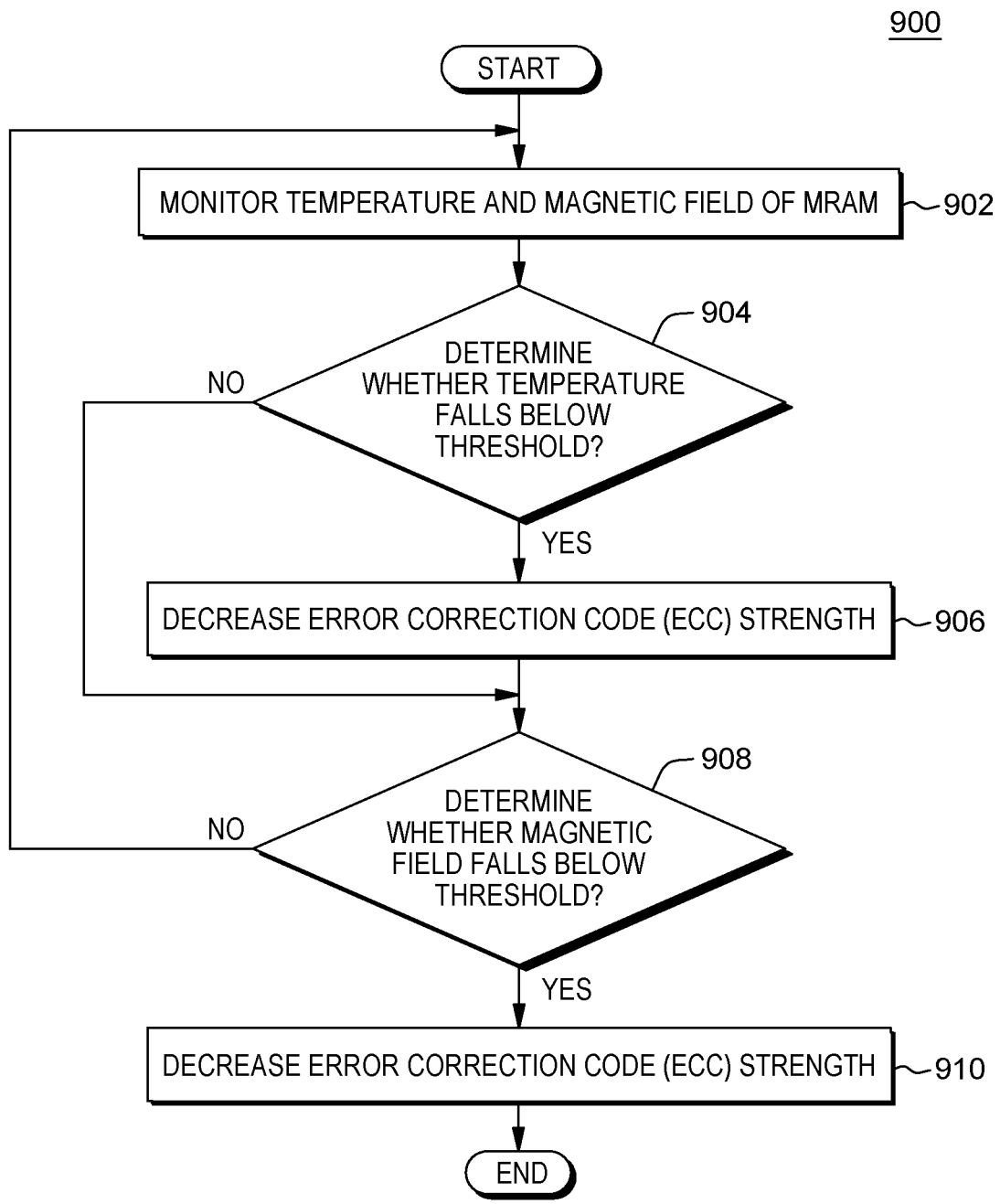
FIG. 9 is a flowchart diagram, generally designated 900, for determining whether to decrease the error correction code strength for correcting bit error in an MRAM chip in accordance with at least one embodiment of the present invention.

FIG. 9 is a flowchart depicting operational steps for dynamically decreasing the ECC strength for correcting bit errors in an MRAM based on detected sensor data in accordance with at least one embodiment of the present invention. It should be noted that although the operational steps in FIG. 9 reference a MRAM, the operational steps in FIG. 9 may equally be applied to any known or future known types of memory technologies or devices.

At step 902, the temperature and magnetic field strength of an MRAM device are monitored. At decision step 904, a determination is made whether a temperature of the MRAM device falls below a predetermined threshold. If it is determined that the temperature of the MRAM device falls below the predetermined threshold, the process proceeds to step 906. If it is determined that the temperature of the MRAM device does not fall below the predetermined threshold, the current ECC strength is maintained, and process proceeds to decision step 908.

At step 906, in response to the temperature falling below the predetermined threshold, the current ECC strength is decreased.

At decision step 908, a determination is made whether a magnetic field strength falls below a predetermined threshold. If it is determined that the magnetic field strength falls below a predetermined threshold, the process proceeds to step 910. If it is determined that the magnetic field strength of the MRAM device does not fall below the predetermined threshold, the current ECC strength is maintained, and the process returns to step 902.

At step 910, in response to the magnetic field strength falling below the predetermined threshold, the current ECC strength is decreased.

What is claimed is:

1. A computer-implemented method for performing data scrubbing on a memory device, comprising:
dynamically altering a frequency at which data scrubbing is performed on the memory device to maintain a particular chip error rate over a lifetime of the memory device, wherein dynamically altering the frequency at which data scrubbing is performed includes:
responsive to determining that a temperature of the memory device reaches and/or exceeds a first predetermined threshold:
increasing the frequency at which data scrubbing is performed on the memory device;

responsive to determining that a magnetic field strength of the memory device reaches or exceeds a second predetermined threshold:
further increasing the frequency at which data scrubbing is performed on the memory device;
responsive to determining that the temperature of the memory device falls below a third predetermined threshold:
decreasing the frequency at which data scrubbing is performed on the memory device;
responsive to determining that the magnetic field of the memory device falls below a fourth predetermined threshold:
further decreasing the frequency at which data scrubbing is performed on the memory device,
wherein respective threshold levels that trigger an alert to dynamically alter the frequency at which data scrubbing is performed on the memory device are programmed based on a current workload using the memory device, characteristics of data stored on the memory device, and the particular chip error rate to be maintained over the lifetime of the memory device.

2. The computer-implemented method of claim 1, wherein the data scrubbing includes a read-only-operation for a memory area of the memory device if no bit errors are detected in the memory area.

3. The computer-implemented method of claim 1, wherein the data scrubbing includes a read-modify-write operation for a memory area of the memory device if one or more bit errors are detected in the memory area.

4. The computer-implemented method of claim 1, wherein the memory device is a Magnetoresistive Random Access Memory (MRAM) device.

5. The computer-implemented method of claim 1, wherein dynamically altering the frequency at which data scrubbing is performed includes:
for every n° C. rise or fall in the temperature of the memory device, increase or decrease a data scrubbing frequency by x; and
for every increase or decrease in n units of Tesla (T) generated by the memory device, increase or decrease the data scrubbing frequency by y.

6. The computer-implemented method of claim 1, wherein dynamically altering the frequency at which data scrubbing is performed includes:
responsive to determining that the temperature of the memory device reaches and/or exceeds the first predetermined threshold:
increasing an error correction code strength of an error correction code associated with the data scrubbing performed on the memory device; and
responsive to determining that the temperature of the memory device falls below the third predetermined threshold:
decreasing the error correction code strength of the error correction code associated with the data scrubbing performed on the memory device.

7. The computer-implemented method of claim 1, wherein dynamically altering the frequency at which data scrubbing is performed includes:
responsive to determining that the magnetic field of the memory device reaches and/or exceeds the second predetermined threshold:
increasing an error correction code strength of an error correction code associated with the data scrubbing performed on the memory device; and responsive to determining that the magnetic field of the memory device falls below the fourth predetermined threshold:
decreasing the error correction code strength of the error correction code associated with the data scrubbing performed on the memory device.

8. A computer program product for performing data scrubbing on a memory device, the computer program product including one or more computer readable storage media and program instructions stored on the one or more computer readable storage media, the program instructions including instructions to:
dynamically alter a frequency at which data scrubbing is performed on the memory device to maintain a particular chip error rate over a lifetime of the memory device, wherein the program instructions to dynamically alter the frequency at which data scrubbing is performed include instructions to:
responsive to determining that at least one of a temperature of the memory device reaches and/or exceeds a first predetermined threshold:
increase the frequency at which data scrubbing is performed on the memory device;
responsive to determining that a magnetic field strength of the memory device reaches or exceeds a second predetermined threshold:
further increase the frequency at which data scrubbing is performed on the memory device;
responsive to determining that the temperature of the memory device falls below a third predetermined threshold:
decrease the frequency at which data scrubbing is performed on the memory device; and
responsive to determining that the magnetic field of the memory device falls below a fourth predetermined threshold:
further decrease the frequency at which data scrubbing is performed on the memory device,
wherein respective threshold levels that trigger an alert to dynamically alter the frequency at which data scrubbing is performed on the memory device are programmed based on a current workload using the memory device, characteristics of data stored on the memory device, and the particular chip error rate to be maintained over the lifetime of the memory device.

9. The computer program product of claim 8, wherein the data scrubbing includes a read-only-operation for a memory area of the memory device if no bit errors are detected in the memory area.

10. The computer program product of claim 8, wherein the data scrubbing includes a read-modify-write operation for a memory area of the memory device if one or more bit errors are detected in the memory area.

11. The computer program product of claim 8, wherein the memory device is a Magnetoresistive Random Access Memory (MRAM) device.

12. A computer system for performing data scrubbing on a memory device, comprising:
one or more computer processors;
one or more computer readable storage media; and
computer program instructions, the computer program instructions being stored on the one or more computer readable storage media for execution by the one or more computer processors, and the computer program instructions including instructions to:
dynamically alter a frequency at which data scrubbing is performed on the memory device to maintain a particular chip error rate over a lifetime of the memory device, wherein the program instructions to dynamically alter the frequency at which data scrubbing is performed include instructions to:

responsive to determining that a temperature of the memory device reaches and/or exceeds a first predetermined threshold:
    increase the frequency at which data scrubbing is performed on the memory device;

responsive to determining that a magnetic field strength of the memory device reaches or exceeds a second predetermined threshold:
    further increase the frequency at which data scrubbing is performed on the memory device;

responsive to determining that the temperature of the memory device falls below a third predetermined threshold:
    decrease the frequency at which data scrubbing is performed on the memory device; and responsive to determining that the magnetic field of the memory device falls below a fourth predetermined threshold:
    further decrease the frequency at which data scrubbing is performed on the memory device, wherein respective threshold levels that trigger an alert to dynamically alter the frequency at which data scrubbing is performed on the memory device are programmed based on a current workload using the memory device, characteristics of data stored on the memory device, and the particular chip error rate to be maintained over the lifetime of the memory device.

13. The computer system of claim 12, wherein the data scrubbing includes:
    a read-only-operation for a memory area of the memory device if no bit errors are detected in the memory area; and
    a read-modify-write operation for a memory area of the memory device if one or more bit errors are detected in the memory area.

14. The computer system of claim 12, wherein the memory device is a Magnetoresistive Random Access Memory (MRAM) device.

\* \* \* \* \*